United States Patent [19]

Ryan

[11] 4,314,184
[45] Feb. 2, 1982

[54] DEFLECTION COIL DRIVER APPARATUS

[75] Inventor: John O. Ryan, Cupertino, Calif.

[73] Assignee: Ampex Corporation, Redwood City, Calif.

[21] Appl. No.: 127,163

[22] Filed: Mar. 4, 1980

[51] Int. Cl.³ .............................................. H01J 29/70
[52] U.S. Cl. ................................... 315/408; 315/397; 315/403
[58] Field of Search ....................... 315/403, 408, 397

[56] References Cited

U.S. PATENT DOCUMENTS 3,983,452  9/1976  Bazin ............................... 315/403 X
4,218,638  8/1980  Breithaupt ....................... 315/403 X Primary Examiner—Malcolm F. Hubler
Attorney, Agent, or Firm—George B. Almeida; Joel D. Talcott

[57] ABSTRACT

A deflection coil driver includes a current driver stage comprising three power transistors, a first power transistor being caused to turn on via a class B transistor stage when an input signal of a first polarity is input to the class B stage, second and third power transistors being caused to turn on via said class B stage when the input signal has an opposite polarity. When turned on, the first power transistor couples current from a positive voltage source to the deflection coil, the second power transistor couples current from a negative voltage source to said coil, and the third power transistor couples said coil to ground. A transistor switch determines whether the second or the third power transistor is on, as a function of the voltage across the deflection coil. The current through the coil is also sensed and provides negative feedback to an input amplifier to ensure that the shape of such current matches the shape of the input signal.

9 Claims, 3 Drawing Figures

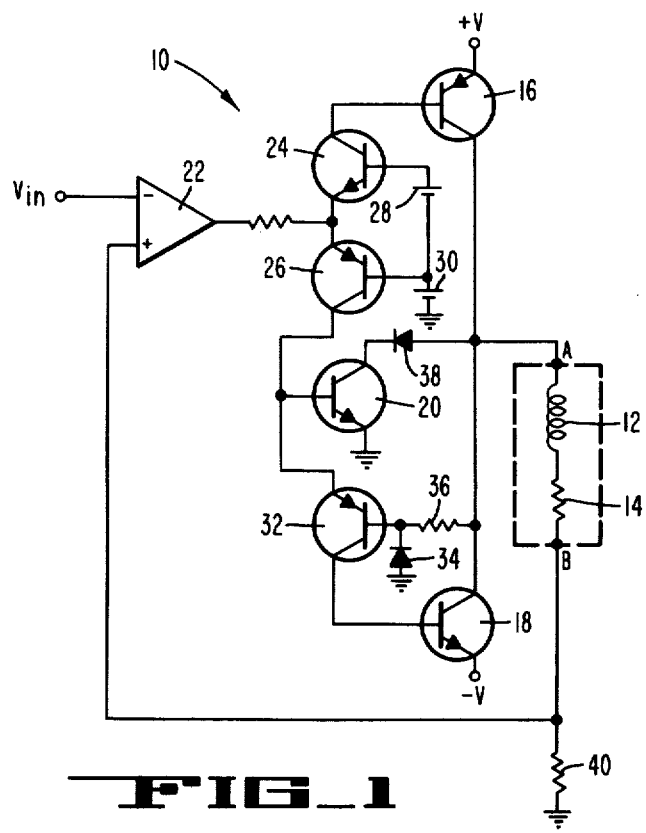
FIG_1
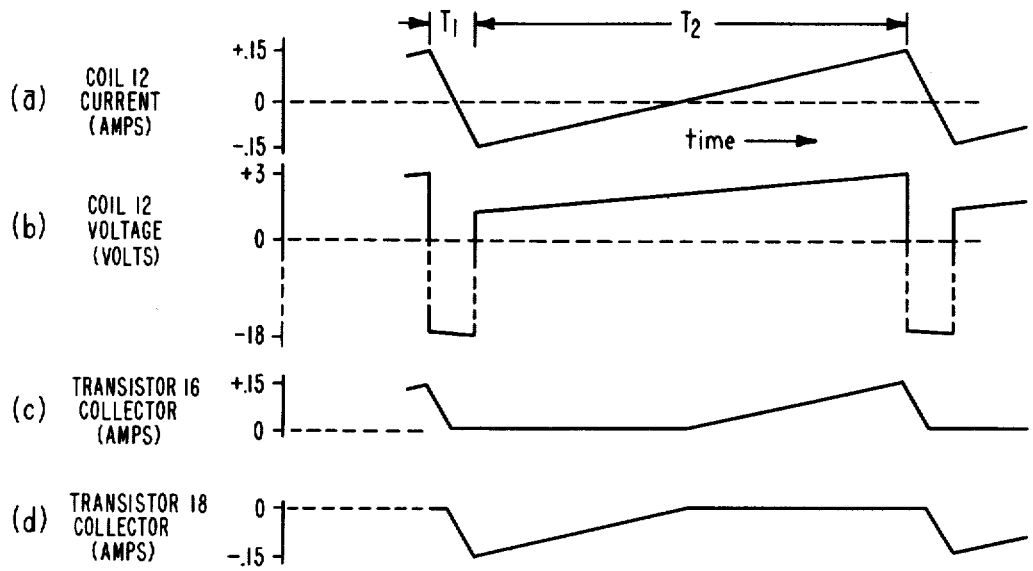
FIG_2

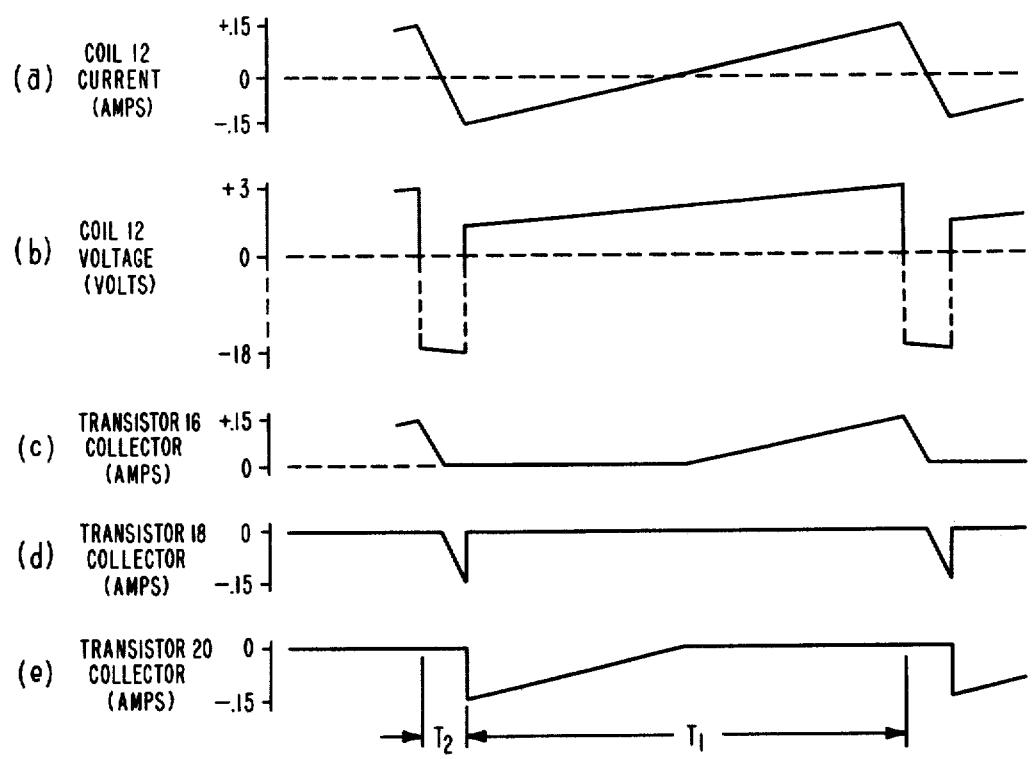
FIG_3

DEFLECTION COIL DRIVER APPARATUS

The present invention relates to means for driving an electron beam deflection coil, and more specifically to an improved deflection coil driver apparatus for use in camera tubes, which apparatus utilizes class B operation, transistor switching and coil current feedback to minimize power consumption and circuit size.

Deflection coils are designed to generate a magnetic field, as a function of the current and voltage of a signal applied thereto, for controlling the deflection of an electron beam across an electron tube. This deflection may be along a horizontal sweep line or vertically across the tube. To minimize distortion, the sweep rate must be at a constant speed, i.e., the input signal to the deflection coil must vary in a precisely linear manner. However, only one sweep direction of the beam need be so well controlled. This is generally during the slower beam sweep time, i.e., the forward time, with the return of the beam, the "flyback time", being performed at a much faster rate.

Critical elements in the design of deflection coils and their drivers, especially in portable camera systems, include the power consumption of such driver circuits and their size and weight. Power consumption is an especially important factor if the camera is powered from a battery pack. There has been a continuous effort in the industry to reduce and minimize as much as possible these elements, such that even improvements of 10 or 20% are significant and very difficult to achieve.

Conventional designs for deflection coil drivers in camera systems utilize a class A stage in conjunction with a high reactance choke, to achieve the desired deflection coil current levels. Class A operation occurs when the bias point is placed so that the signal swing does not carry the operation of the device out of its active region. The power requirements of the class A amplifier and the bulk and cost of the choke place serious constraints on the design of compact, lightweight camera systems. The problem is exacerbated by the fact that most cameras today are color cameras which require three such deflection coil drivers, one for each color channel.

In addition, some prior art systems controlled the voltage across the deflection coil by means of an input voltage sawtooth waveform, for generation of the beam deflection. A more linear and stable way of generating linear beam deflection is by forcing the desired level of current through the deflection coil, rather than by controlling the voltage across the coil. One disadvantage of controlling the voltage is that variations with temperature of the resistance of the coil windings result in variations in the current through the coil, and thus, variations in beam movement. This temperature sensitivity becomes important when a portable camera, for example, is used out of doors rather than in the controlled climate of a TV studio. Precise linearity of the deflection coil output is made particularly important in color camera systems, wherein these separate deflection coils must have matching operation in the sweep of the red, green and blue electron beams to provide correct color in the resulting images.

Therefore, an object of the present invention is to provide an improved deflection coil driver apparatus which minimizes power consumption, weight and size, while maximizing the linearity of the magnetic field generated by the deflection coil.

Another object of the present invention is to provide an apparatus of the foregoing type which operates in a class B mode wherein an additional choke is not required to achieve the desired level of current driving of the deflection coil.

A further object of the present invention is to provide an improved deflection coil driver apparatus wherein a transistor switch is used to draw off current from the deflection coil to ground rather than to the negative power supply during a portion of each deflection cycle, to reduce the power required to drive the coil.

A still further object of the present invention is to provide an improved deflection coil driver apparatus having negative feedback of the level of current being driven through the deflection coil to an input amplifier, to provide error correction with respect to the shape of the sawtooth voltage waveform.

These and other objects and advantages of the present invention will become apparent upon reference to the following detailed description and the accompanying drawings, in which:

FIG. 1 is a schematic circuit diagram of a deflection coil driver apparatus according to the present invention;

FIGS. 2(a)-2(d) are timing diagrams illustrating the operation of a class B coil driver circuit without the improvements of the present invention; and FIGS. 3(a)-3(e) illustrate timing diagrams of the deflection coil driver apparatus according to the present invention.

Broadly stated, the present invention is a deflection coil driver apparatus including switch means for diverting deflection coil current to ground rather than to the negative power source when the current through the coil is negative but has an increasing slope, corresponding to a positive voltage across the coil. More specifically, the apparatus according to the present invention includes a first power transistor connected such that current is coupled from a positive voltage source to a deflection coil when the first power transistor is turned on. A second power transistor is also provided for coupling current from a negative voltage source to the deflection coil when this second power transistor is turned on. A third power transistor is also provided for coupling current from the deflection coil to ground when this third power transistor is turned on. Means are also provided for generating via a class B amplifier, a current on a first path when an input signal has one polarity and for generating a current on a second path when the input signal has the opposite polarity. The first power transistor is caused to go on in response to the generation of the first path current, and switch means are provided for sensing the voltage across the deflection coil and for causing the second path current to actuate the third power transistor when this voltage is positive and for actuating the second power transistor when the voltage is negative. Means are also provided for sensing the current through the deflection coil and for using this signal as negative feedback to an input amplifier, to ensure that the current waveform through the coil always matches the sawtooth shape of the voltage waveform.

Referring now to FIG. 1, a deflection coil driver apparatus, illustrated at 10, provides driving current for a deflection coil. The deflection coil 12 is connected to the driver 10 via terminals A and B. Note that the coil 12 includes a small residual resistance 14.

Three power transistors are used for driving the coil 12 according to the present invention. These transistors include a first power transistor 16, a second power transistor 18 and a third power transistor 20. When a current is applied to transistor 16, causing it to go on, it enables current to be supplied to deflection coil 12 from the positive voltage source +V. Similarly, when current is applied to the base of transistor 18, it causes this transistor to go on, thereby causing the negative voltage source −V to draw current out of the coil 12. Finally, third power transistor 20 operates to switch terminal A of coil 12 to ground when current is applied to the base of this transistor.

An input voltage signal in the shape of a sawtooth waveform, is applied to an inverting input of an operational amplifier 22. The output of this amplifier 22 is applied to a class B amplifier stage comprising two transistors, shown at 24 and 26, having their emitters connected together. Class B operation occurs when the bias point of these transistors is located just at cut off. Any signal swing above this bias point (turning on transistor 24 if the input is of one polarity, and turning on transistor 26 if the input is of the opposite polarity) is amplified normally by the respective transistor 24 or 26 and any signal below cut off is not operated on by this transistor. Thus, in the present invention, one of these transistors, 24 or 26, amplifies the positive signals from the amplifier 22 and the other amplifies the negative signals therefrom. A forward bias voltage is preferably applied to each transistor 24 and 26 to bias them slightly out of the cut off region to minimize crossover distortion. This biasing is shown diagrammatically at the base of each transistor 24 and 26 through the use of power sources 28 and 30 connected thereto.

A transistor 32, diode 34 and resistor 36, comprise switch means for sensing the voltage at terminal A and for causing transistor 20 to go on when the terminal A voltage is positive and to cause transistor 18 to go on when the terminal A voltage is negative. In other words, the transistor 32 operates to steer the current out of the class B amplifier transistor 26 to either the base of the transistor 20 or the base of the transistor 18. Specifically, when the voltage at the collector of the transistor 18 is negative, the base of the transistor 32 is held at about −0.7 volts by the action of the resistor 36 and the diode 34. The emitter of this transistor 32 is therefore at approximately 0.0 volts, thereby causing transistor 20 to be turned off and at the same time steering the collector current out of transistor 26 into the base of transistor 18. When the voltage at terminal A is positive, the transistor 32 is turned off, since its emitter is clamped to +0.7 volts by the operation of the transistor 20. This off state of the transistor 32 causes the current out of the transistor 26 to be diverted into the base of transistor 20, causing this latter transistor to go on. A diode 38 prevents the reverse breakdown of the transistor 20 collector-base junction when the collector of transistor 18 is negative.

Negative feedback provided by the voltage generated across a resistor 40 is coupled to the amplifier 22. Feedback is needed to ensure that the current waveform through the coil 12 matches as closely as possible the shape of the input waveform, to minimize distortion in the resultant output video signal. In other words, the feedback is needed to ensure linearity in the beam sweep rate as it traverses across the tube. This feedback also eliminates other distortions caused by the operation of the class B amplifier.

The current coupled through coil 12 by the coil driver apparatus according to the present invention, as described above, develops the voltage across the resistor 40. This sensed voltage is applied to the non-inverting input of the amplifier 22. Inversion of the signal in the driver stage causes the overall feedback to the negative. This signal is used by amplifier 22 to generate an error correction signal for the driver 10. In accordance with conventional feedback principles, therefore, the voltage across the resistor 40 will be identical in shape and amplitude to the input voltage $V_{in}$, and consequently the current through the deflection coil will equal $V_{in}$ divided by the resistance value of the resistor 40.

To more clearly understand how the operation of the power transistor 20 and the switching transistor 32 reduce the power required to operate the deflection coil driver apparatus 10 according to the present invention, reference is made to FIG. 2. FIG. 2 illustrates the operation of the circuit 10 with the transistors 20 and 32 omitted, i.e., with the collector of the transistor 26 directly coupled to the base of the transistor 18.

As seen in FIG. 2(a), the coil 12 current is a sawtooth waveform whose trailing edge represents the beam flyback time $T_1$ of the coil and whose longer leading edge represents the beam forward time $T_2$ of the coil. As described above, to prevent distortion in the resulting video signal, the shape of this current must be linear, especially during the time that the leading edge is generated. For typical values of the coil and the sense resistor 40, e.g., a coil inductance of 400 microhenries, a coil resistance of 3 ohms, and a sense resistance of 2 ohms, and with a forward scan time of approximately 60 microseconds and a flyback time of about 60/9 microseconds, the peak-to-peak coil 12 current will be about 300 milliamps.

To calculate the average current, if $I_p$ represents half the peak-to-peak value of the current through the coil 12, then the average current required from each of the power sources +V and −V is provided by:

$$I_{supply} = (I_p + I_o)^2 / 4I_p$$

It should be understood that an added current $I_o$ may need to be provided if it is desired to shift the current through the coil either above or below a zero current average, to enable the centering of the beam in the tube.

FIG. 2(b) illustrates the voltage across the coil 12 at corresponding points in time with respect to the coil 12 current. With the above exemplary circuit values, this voltage varies from about +2.75 to almost −18 V. Therefore, to keep the transistors 16 and 18 out of saturation, the voltage source +V must have a value of at least 3 volts, and the negative source −V must have a value of at least −18 volts. This results from the fact that, as can be seen from this voltage curve, the average voltage over time must always be 0, since the voltage is generated across an inductor. Thus, since the trailing edge of the coil current only occurs for a short period of time, the negative voltage generated thereby must be much greater than the positive voltage to average 0. The positive voltage, on the other hand, only need rise to 3 volts due to the longer forward scan time of coil 12. Perhaps the characteristics of this voltage curve can be more readily understood if it is recalled that the voltage across an inductor is equal to the derivative of the current through the inductor, i.e., $V = L\, dI/dT$.

Note also that the voltage curve across coil 12 only approximates a rectangular pulse waveform. An ideal inductor would generate rectangular pulses, with a positive constant voltage level existing while a linear increasing current ramp was being coupled through the inductor and a negative constant voltage level existing when a linear decreasing current ramp was being coupled through it. The nonlinearity of the voltage curve is caused by the coil winding resistance 14. Coil impedance 14 creates a negligible sawtooth waveform, due to the overriding inductive effects of the coil 12, which is superimposed on the ideal rectangular waveform, due to the voltage generated by this resistive effect. However, the average voltage still remains at 0.

The curves for transistors 16 and 18 are also shown in FIG. 2(c) and 2(d). As can be seen, when the transistors 20 and 32 are omitted from the circuit, the collector of the transistor 16 provides the positive current for the coil 12 and the collector of transistor 18 provides the negative current for the coil 12 during each sawtooth waveform cycle.

To determine the power consumption of this circuit, we note, from above, that the current through the coil 12 varies between + and − 150 milliamps. Thus, due to the triangular shape of the current curve, the average of the current through the coil 12 provided by each of the transistors 16 and 18 is approximately 150 milliamps divided by 4, or 37.5 milliamps. Thus, the total power consumed by the circuit would be about 37.5 milliamps × 18 volts + 37.5 milliamps × 3 volts = aprox. 0.8 watts.

Turning now to the operation of the present invention and referring to FIGS. 3(a)–3(e), the present invention provides a significant reduction in power consumption over the above described circuit. With the inclusion of the two transistors 20 and 32, the driver apparatus 10 operates in the following manner. The present invention eliminates the sinking of current through the transistor 18 during most of the time that current is flowing in a negative direction through the coil 12. The improved circuit takes advantage of the fact that although the negative current is flowing through the coil 12, the voltage across the coil 12 remains positive so long as the slope of the rate of change of the coil 12 current is positive, i.e., the forward scan time. It is only during the time that the slope of the rate of change of the coil 12 is negative, the flyback time, that the voltage across the coil is negative. Thus, the present invention diverts this negative current to ground rather than through the negative voltage supply −V during this period when the voltage across the coil 12 is positive. A calculation of the power saving obtained from this circuit is given hereinbelow.

As described above, the operation of switching transistor 32 allows the current path from the transistor 26 to be coupled to the third power transistor 20 when the voltage at terminal A is positive, and diverts the current from transistor 26 to the base of the transistor 18 when the voltage at terminal A is negative. This operation of the power transistors is illustrated in FIG. 3. As is seen in FIG. 3(c), the collector current of the transistor 16 is coupled to the coil 12 to the same extent as if the transistors 20 and 32 were not in circuit. However, as seen in FIG. 3(d), the transistor 18 only goes on, thereby sinking current from the coil 12, during the flyback time, when the voltage across the coil 12 is also negative. Once the voltage across coil 12 goes positive, the transistor 18 goes off and the transistor 20 goes on, as seen in FIG. 3(e), thereby sinking the current from the coil 12 to ground rather than through the negative voltage supply.

Therefore, with the driver apparatus 10 according to the present invention, the average current from the negative voltage supply −V is now only approximately 3.75 milliamps. Thus, applying a similar calculation as described above, the total power consumed by the circuit is now only approximately 0.18 watts instead of the previously obtained 0.8 watts. Thus, a power consumption of only approximately 22.5% of the previously required level of consumption is now needed. In practice, the power consumption will be slightly greater than the above calculations indicate due to deflection coil losses, etc.

Putting the above in equation form, the reduction in power required from this negative voltage supply is now a function of forward scan and flyback timing, i.e., it can be illustrated with respect to the forward time $T_2$ and the flyback time $T_1$ of the sawtooth waveform in the following manner:

$$I_{supply} = \frac{(I_p + I_o)^2}{4I_p} \times \frac{T_1}{T_1 + T_2}$$

Therefore, the total power consumed by the driver 10 apparatus according to the present invention is given by:

$$P = \frac{|+V| \times (I_p + I_o)^2}{4I_p} + \frac{|-V| \times (I_p + I_o)^2 \times T_1}{4I_p \times (T_1 + T_2)}$$

It is of course understood that although a preferred embodiment of the present invention has been illustrated and described, various modifications, alternatives and equivalents thereof will become apparent to those skilled in the art and, accordingly, the scope of the present invention should be defined only by the appended claims and equivalents thereof.

Various features of the invention are defined in the following claims.

What is claimed is:

1. In a deflection coil driver apparatus of the type which has a class B amplifier for driving a deflection coil via one of a plurality of power transistors, the improvement comprising:
   transistor switch means coupled to sense the voltage on the deflection coil and for turning on one of said power transistors when the sensed voltage is negative such that said coil is coupled to a negative voltage source for generating a negative current of negative slope, and for turning on another of said power transistors when the sensed voltage is positive such that said coil is coupled directly to ground rather than to a negative voltage source to generate a negative current of positive slope; and
   said deflection coil being coupled to a positive voltage source via still another power transistor to generate in the coil a positive current of positive slope.

2. A deflection coil driver apparatus comprising:
   a deflection coil;
   a first power transistor connected such that current is coupled from a positive voltage source to said deflection coil when said first power transistor is turned on;

a second power transistor connected such that current is coupled from a negative voltage source to said deflection coil when said second power transistor is turned on;

a third power transistor connected such that current is coupled from said deflection coil to ground when said third power transistor is turned on;

means for generating a first current when an input signal has one range of values and for generating a second current when said input signal has a second range of values;

means for coupling said first current to said first power transistor such that it goes on so long as said first current remains on; and switch means for sensing the voltage at said terminal and for causing said second current to be coupled to said third power transistor when said deflection coil voltage is positive, thereby turning on said third power transistor so long as said second current remains coupled thereto, and for causing said second current to be coupled to said second power transistor when said deflection coil voltage is negative, thereby turning on said second power transistor so long as said second current remains coupled thereto.

3. The deflection coil apparatus of claim 2, wherein said switch means comprises:

a fourth transistor including a base, an emitter, and a collector;

a resistor; and a diode, the base of said transistor being coupled to said resistor, the opposite end of said resistor being coupled to said deflection coil, said diode being connected between ground and said base of said transistor, said second current being coupled to the emitter of said transistor, and said collector being coupled to said second power transistor.

4. The deflection coil apparatus of claim 2 further comprising means operatively attached between said deflection coil and said third power transistor for preventing junction breakdown in said third power transistor when said deflection coil voltage is negative.

5. The deflection coil apparatus of claim 2 wherein said first range of values comprises all positive polarity signals and said second range of values comprises all negative polarity signals.

6. A deflection coil driver apparatus comprising:

a deflection coil connected between a first terminal and a second terminal;

an amplifier for amplifying an input signal;

a first power transistor connected such that current is coupled from a positive voltage source to said first terminal when said first power transistor is turned on;

a second power transistor connected such that current is coupled from a negative voltage source to said first terminal when said second power transistor is turned on;

a third power transistor connected such that current is coupled from said first terminal to ground when said third power transistor is turned on;

means for generating a first current when said amplified input signal has one polarity and for generating a second current when said amplified input signal has the opposite polarity;

means for coupling said first current to said first power transistor such that it goes on so long as said first current remains on;

switch means for sensing the voltage at said first terminal and for causing said second current to be coupled to said third power transistor when said first terminal voltage is positive, thereby turning on said third power transistor so long as said second current remains coupled thereto, and for causing said second current to be coupled to said second power transistor when said first terminal voltage is negative, thereby turning on said second power transistor so long as said second current remains coupled thereto;

means connected to said second terminal for sensing the current through said coil and for coupling said sensed current to said amplifier, said amplifier acting in response thereto to generate an error correction signal in said amplified input signal.

7. The deflection coil apparatus of claim 6, wherein said switch means comprises:

a fourth transistor including a base, an emitter, and a collector;

a resistor; and a diode, the base of said transistor being coupled to said resistor, the opposite end of said resistor being coupled to said first terminal, said diode being connected between ground and said base of said transistor, said second current being coupled to the emitter of said transistor, and said collector being coupled to said second power transistor.

8. The deflection coil apparatus of claim 6 further comprising means operatively attached between said first terminal and said third power transistor for preventing junction breakdown in said third power transistor when said first terminal voltage is negative.

9. A deflection coil driver apparatus comprising:

a deflection coil connected between a first terminal and a second terminal;

an amplifier for amplifying an input signal;

means connected to said second terminal for sensing the current through said coil and for coupling said sensed current to said amplifier, said amplifier acting in response thereto to generate an error correction signal in said amplified input signal;

a first power transistor connected such that current is coupled from a positive voltage source to said first terminal when said first power transistor is turned on;

a second power transistor connected such that current is coupled from a negative voltage source to said first terminal when said second power transistor is turned on;

a third power transistor connected such that current is coupled from said first terminal to ground when said third power transistor is turned on;

class B amplifier means, including a first class B biased transistor and a second class B biased transistor for generating a first current through said first class B transistor when said amplified input signal has one range of value, said second class B transistor generating a second current when said amplified input signal has a second range of values;

means for coupling said first current to said first power transistor such that it goes on so long as said first current remains on;

switch means for sensing the voltage at the first terminal and for causing said second current to be coupled to said third power transistor when said first terminal voltage is positive, thereby turning on said third power transistor so long as said second current remains coupled thereto, and for causing said second current to be coupled to said second power transistor when said first terminal voltage is negative, thereby turning on said second power transistor so long as said second current remains coupled thereto.

* * * * *